(12) United States Patent
Schrans et al.

(10) Patent No.: US 10,404,035 B2
(45) Date of Patent: Sep. 3, 2019

(54) RELIABLE LASER LIGHT SOURCE

(71) Applicant: ROCKLEY PHOTONICS LIMITED, London (GB)

(72) Inventors: Thomas Pierre Schrans, Temple City, CA (US); Nicholas Kucharewski, San Jose, CA (US); Pradeep Srinivasan, Fremont, CA (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 15/946,345

(22) Filed: Apr. 5, 2018

(65) Prior Publication Data

US 2018/0294621 A1    Oct. 11, 2018

Related U.S. Application Data

(60) Provisional application No. 62/482,603, filed on Apr. 6, 2017.

(51) Int. Cl.
| | |
|---|---|
| *H01S 5/068* | (2006.01) |
| *H04B 10/564* | (2013.01) |
| *H04B 10/50* | (2013.01) |
| *H04B 10/032* | (2013.01) |
| *G02B 6/42* | (2006.01) |
| *H01S 5/40* | (2006.01) |
| *H01S 5/125* | (2006.01) |

(52) U.S. Cl.
CPC ........ *H01S 5/06825* (2013.01); *G02B 6/4278* (2013.01); *G02B 6/4286* (2013.01); *H01S 5/4025* (2013.01); *H04B 10/032* (2013.01); *H04B 10/506* (2013.01); *H04B 10/564* (2013.01); *H01S 5/125* (2013.01)

(58) Field of Classification Search
CPC . H01S 5/06825; H01S 5/4025; H04B 10/564; H04B 10/506; H04B 10/032; G02B 6/4278; G02B 6/4286
See application file for complete search history.

(56) References Cited

U.S. PATENT DOCUMENTS 6,769,812 B1 * 8/2004 Handforth ............ G02B 6/3897
                                                385/75
9,876,329 B2    1/2018 Raz et al.
(Continued)

FOREIGN PATENT DOCUMENTS

EP        0 537 409 A2    4/1993

OTHER PUBLICATIONS

Partial Search Report and Invitation to Pay Fees from the International Searching Authority, dated Aug. 28, 2018, Corresponding to PCT/IB2018/000459, 13 pages.

*Primary Examiner* — Ryan A Lepisto
(74) *Attorney, Agent, or Firm* — Lewis Roca Rothgerber Christie LLP

(57) ABSTRACT

A laser source. In some embodiments, a multiple-output laser source includes a plurality of lasers, and a coupler having a plurality of inputs and a plurality of outputs. Each of the inputs of the coupler is connected to an output of a respective laser, and each of the outputs of the coupler is connected to an output of the multiple-output laser source. In some embodiments the laser source is connected to other equipment with a single composite connector for making an optical connection and a plurality of electrical connections.

15 Claims, 5 Drawing Sheets

(56) References Cited

U.S. PATENT DOCUMENTS

| | | |
|---|---|---|
| 2003/0011845 A1 | 1/2003 | Billet et al. |
| 2014/0334812 A1 | 11/2014 | Noguchi |
| 2015/0155945 A1* | 6/2015 | Urino .................. H04B 10/032 398/17 |
| 2018/0006727 A1 | 1/2018 | Young et al. |

* cited by examiner

RELIABLE LASER LIGHT SOURCE

CROSS-REFERENCE TO RELATED APPLICATION(S)

The present application claims priority to and the benefit of U.S. Provisional Application No. 62/482,603, filed Apr. 6, 2017, entitled "PLUGGABLE LASER MODULE", the entire content of which is incorporated herein by reference.

FIELD

One or more aspects of embodiments according to the present invention relate to optical data transmission, and more particularly to a laser light source for a system for optical data transmission.

BACKGROUND

Laser reliability may be a concern in systems relying on optics for interconnections. Such systems may include, for example, one or more lasers supplying unmodulated light to a plurality of transmitters, each including a respective optical modulator, which modulates the received unmodulated laser light to form a modulated optical signal carrying data to be transmitted optically. In such a system, if a single laser supplies light to a plurality of modulators, the failure of such a laser may result in a plurality of optical transmitters becoming disabled, i.e., the "blast radius" of the failure of the laser may be significant.

Thus, there is a need for an optical system with reduced vulnerability to laser failures.

SUMMARY

According to an embodiment of the present invention there is provided a multiple-output laser source, including: a plurality of lasers; and a coupler, the coupler having a plurality of inputs each connected to an output of a respective laser, and a plurality of outputs, each connected to an output of the multiple-output laser source.

In one embodiment, the coupler is a multi-mode interference coupler.

In one embodiment, the coupler is a codirectional coupler.

In one embodiment, the plurality of lasers includes two lasers, and the coupler includes two inputs and two outputs.

In one embodiment, the coupler is configured: to receive optical power at a first input of the two inputs; to deliver a first fraction of the received optical power to a first output of the two outputs; and to deliver a second fraction, substantially equal to the first fraction, of the received optical power to a second output of the two outputs.

In one embodiment, the plurality of lasers includes four lasers, and the coupler includes four inputs and four outputs.

In one embodiment, the plurality of lasers includes eight lasers, and the coupler includes eight inputs and eight outputs.

In one embodiment, the least frequency separation between any pair of lasers of the plurality of lasers is greater than 30 GHz.

In one embodiment, the greatest wavelength separation between any pair of lasers of the plurality of lasers is less than 13 nm.

In one embodiment, the multiple-output laser source includes a control circuit configured: to control the output power of the lasers of the plurality of lasers to be substantially equal; to detect a failure of one of the plurality of lasers, and, in response to detecting the failure of one of the lasers, to increase the output power of one or more of the remaining lasers.

In one embodiment, the multiple-output laser source includes a control circuit configured: to control the output power of a first laser of the plurality of lasers to be at a set power level; to detect a failure of the first laser, and, in response to detecting the failure of the first laser: to shut off the first laser; to turn on a second laser of the plurality of lasers; and to control the output power of the second laser to be at the set power level.

According to an embodiment of the present invention there is provided a laser module, including: a laser; and a composite connector, the composite connector including an optical connector and an electrical connector, the electrical connector and the optical connector having the same engagement direction.

In one embodiment, the laser module is configured to be connected to a piece of equipment including a plurality of optical transmitters, a subset of the plurality of optical transmitters being configured to receive light directly from the laser module, and the remainder of the plurality of optical transmitters not being configured to receive light directly from the laser module, the laser module is configured to be: connected to the piece of equipment, and disconnected from to the piece of equipment, without shutting off power and: without damaging circuitry in the laser module, without damaging circuitry in the piece of equipment, and without interfering with the optical transmitters not configured to receive light directly from the laser module.

In one embodiment, the laser includes a plurality of optical transmitters, a subset of the plurality of optical transmitters being configured to receive light directly from the laser module, and the remainder of the plurality of optical transmitters not being configured to receive light directly from the laser module, the laser module is configured to be: connected to the piece of equipment, and disconnected from to the piece of equipment, without shutting off power and: without damaging circuitry in the laser module, without damaging circuitry in the piece of equipment, without impairing the operation of the optical transmitters configured to receive light directly from the laser module, and without interfering with the optical transmitters not configured to receive light directly from the laser module.

According to an embodiment of the present invention there is provided a system, including: a photonic integrated circuit, including: a first modulator; a second modulator; and a coupler, the coupler having: a plurality of inputs each configured to receive unmodulated light from a laser, and a plurality of outputs, including a first output connected to the first modulator and a second output connected to the second modulator.

In one embodiment, the system includes: a first laser module including a first laser and having a first connector, the first laser being connected, through the first connector, to a first input of the plurality of inputs of the coupler; and a second laser module including a second laser and having a second connector, the second laser being connected, through the second connector, to a second input of the plurality of inputs of the coupler.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a laser light source provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
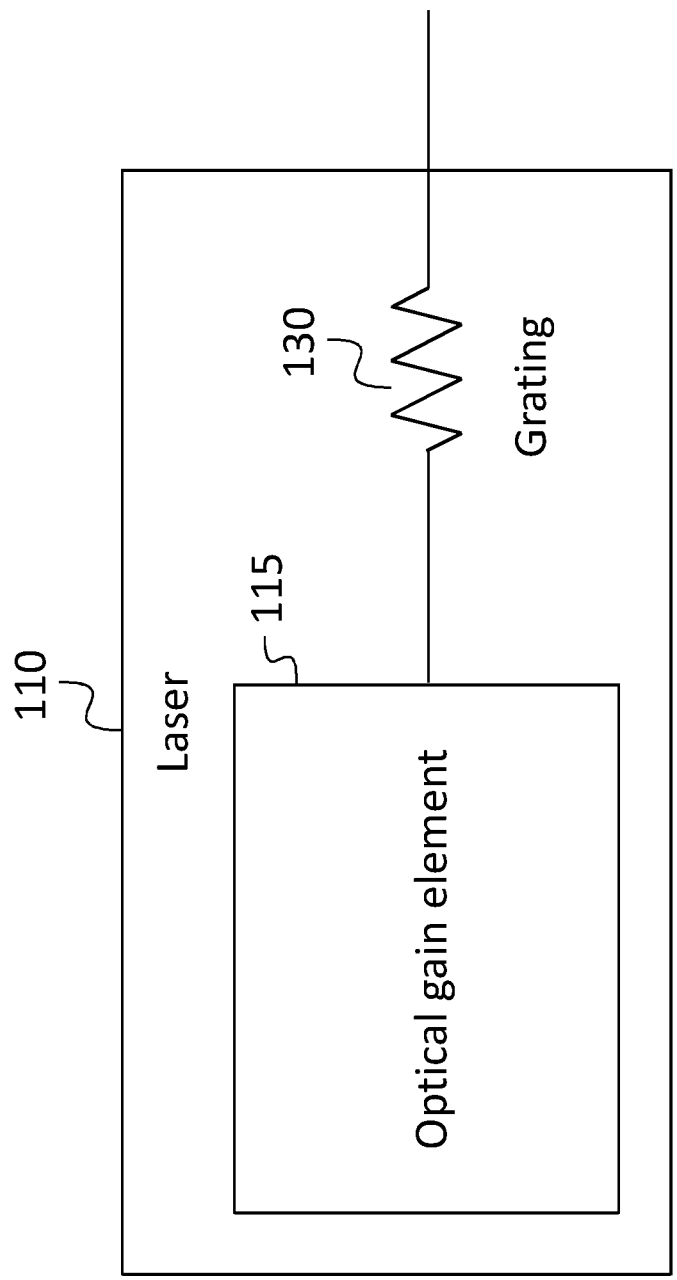
FIG. 1 is a block diagram of a laser, according to an embodiment of the present invention.

In some embodiments a laser light source includes a plurality of lasers 110, one of which is illustrated in FIG. 1. The laser 110 may be a fiber-coupled hybrid distributed Bragg reflector (DBR) laser which includes a gain element 115 and a silicon photonics (or "Si Photonics") grating 130. The gain element may be a reflective semiconductor optical amplifier (RSOA), i.e., a semiconductor element that may be configured (e.g., by application of a bias current) to provide optical gain, and which includes a mirror at one end. The mirror may act as the back mirror of the laser 110 and the grating may act as the output coupler of the laser 110. The grating may be a Si Photonic Bragg grating having a reflectance peak within the range of wavelengths over which the gain element 115 provides gain, the reflectance peak being at a wavelength selected in accordance with principles discussed in further detail below. In some embodiments, the gain element is itself a laser (e.g., a distributed feedback (DFB) laser) and no Si Photonics grating is used.

Figure 2:
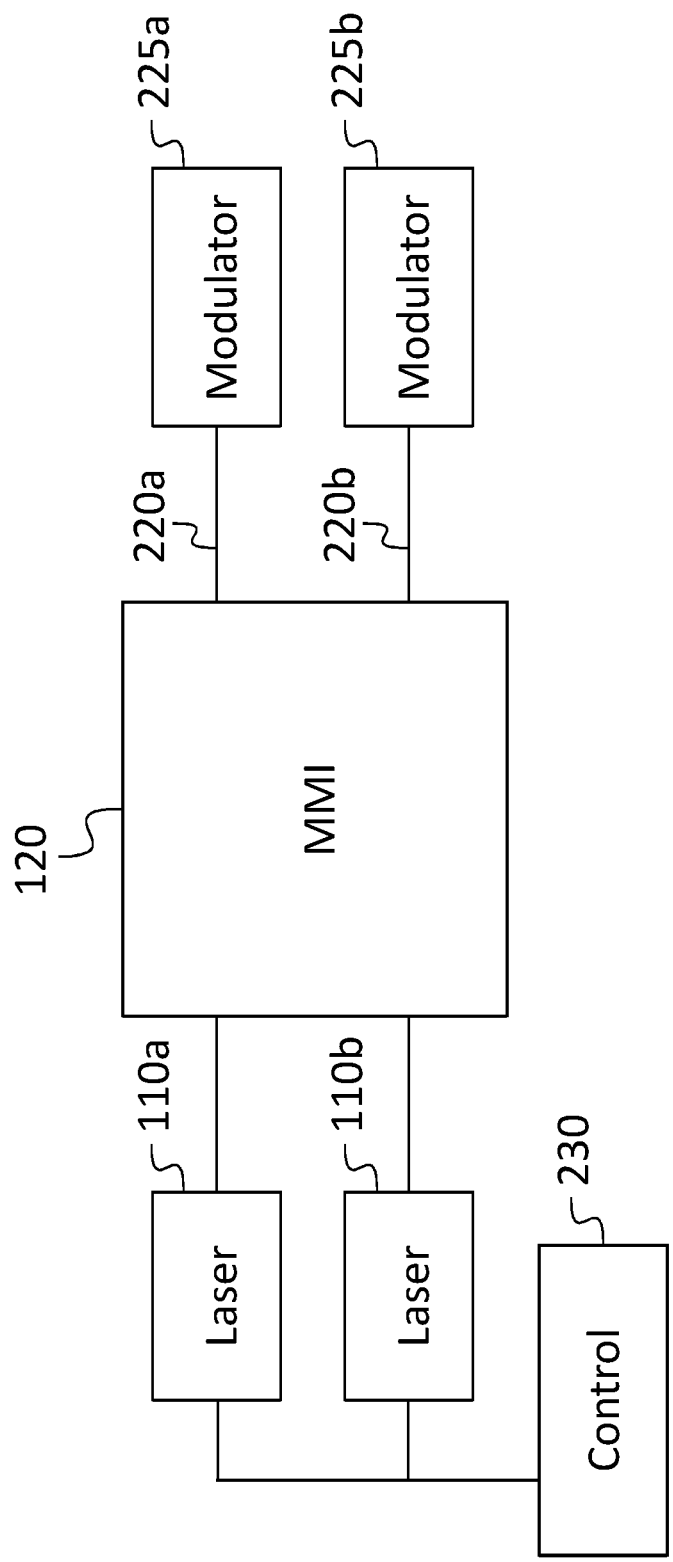
FIG. 2 is a block diagram of a laser light source, according to an embodiment of the present invention.

Referring to FIG. 2, in some embodiments light from a first laser 110a and from a second laser 110b may be combined in a passive coupler 210. The coupler 210 may have a first output 220a and a second output 220b, and each of the two outputs may carry a fraction of the light of the first laser 110a and a fraction of the light of the second laser 110b. If the coupler is a symmetric low-loss coupler, then one half of the optical power produced by the first laser 110a may be present at the first output 220a and the other half of the optical power produced by the first laser 110a may be present at the second output 220b. Similarly one half of the optical power produced by the second laser 110b may be present at the first output 220a and the other half of the optical power produced by the second laser 110b may be present at the second output 220b. The coupler may be any suitable coupler having a plurality of inputs and a plurality of outputs, such as a multi-mode interference (MMI) coupler (as shown in FIG. 2), or a codirectional coupler. A codirectional coupler may include parallel waveguides sufficiently close together that the optical modes they support overlap. Such waveguides may be waveguides on a silicon photonics chip, for example, or optical fibers.

Each of the outputs 220a, 220b of the coupler 210 may be connected to a respective modulator 225a, 225b (as shown), or to a plurality of modulators in one or more transmitters. If one of the lasers 110a, 110b, e.g., the first laser 110a, fails, each of the modulators 225a, 225b continues to receive one half of the total optical power it received before the failure. A control circuit 230 may be employed to detect when one of the lasers fails, and to increase the output of the other laser when this occurs (e.g., by a factor of two, or nearly a factor of two), so that the reduction in the power received by the modulators 225a, 225b is eliminated or reduced. Each laser may include a monitor photodiode (which may also be used for a local power-stabilization control loop, controlling the laser drive current to maintain constant optical output power); the signal from this monitor photodiode may be used by the control circuit 230 to detect the failure of one of the lasers 110a, 110b, and, when a failure occurs, to increase the output power of the other laser (e.g., by directly increasing the drive current in the other laser, or by increasing the setpoint of the optical power control loop in the other laser). In some embodiments the failure of one of the lasers 110a, 110b may be detected in another manner, e.g., by a dedicated photodiode coupled to the output fiber of the laser. As used herein the "failure" of a laser means sufficiently great degradation of performance that the optical output power requirements of the system are no longer being met.

If the wavelengths of the lasers 110a, 110b are not identical and are separated by an amount corresponding to a frequency difference that is less than or comparable to the modulation rates at which the modulators 225a, 225b operate, then amplitude modulation at each of the outputs 220a, 220b resulting from beating together of the laser frequencies may interfere with reliable transmission of data. Accordingly measures may be taken to ensure that their frequency separation is sufficiently large to avoid unacceptable beat tones. For example, if each modulator 225a, 225b is configured to operate at a modulation frequency of 25 GHz, the wavelengths of the lasers may be selected (e.g., by selection of the respective gratings 130) to differ sufficiently (e.g., differing by 0.4 nm if the center wavelengths are 1550 nm) that the beat frequencies exceed, e.g., 30 GHz or 50 GHz. Such wavelength differences may be sufficiently small that several wavelengths, each for a respective laser, may fit within each of the (13 nm wide) wavelength bands of a coarse wavelength division multiplexing (CWDM) system, in which the center wavelengths of adjacent bands may be separated by 20 nm. In some embodiments, the wavelength difference is selected to be greater than the minimum acceptable difference (e.g., greater than 0.4 nm) so that changes in the wavelength difference that may occur as a result of aging of the lasers or of changes in temperature will not cause the wavelength difference to become unacceptably small. To the same end, in some embodiments measures are taken (e.g., the use of a shared enclosure or shared heat sink) to reduce temperature differences between the lasers 110a, 110b and/or their respective gratings 130.

Figure 3:
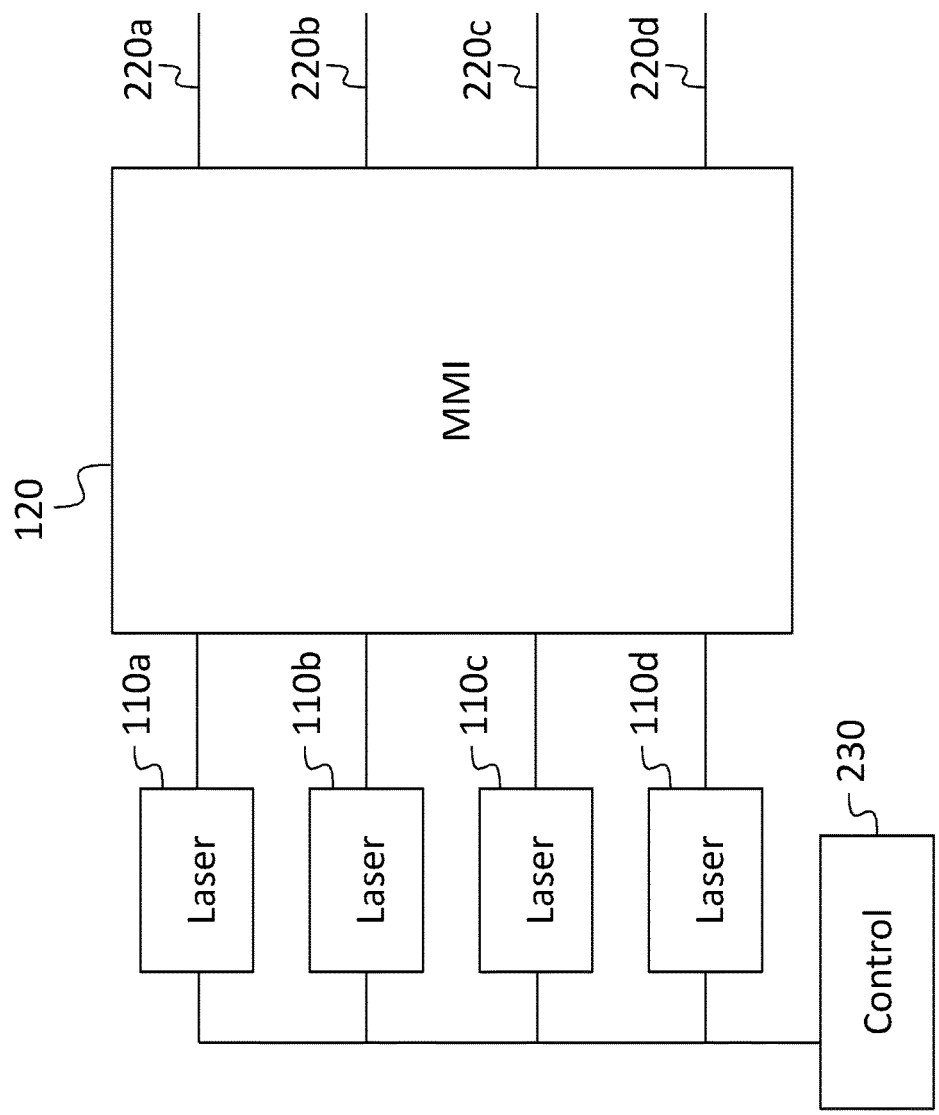
FIG. 3 is a block diagram of a laser light source, according to an embodiment of the present invention.

In some embodiments, to avoid the need to increase the power of one laser by a factor of two or by nearly a factor of two when the other laser fails, an analogous multiple-output laser source may be constructed as shown in FIG. 3. In the embodiment of FIG. 3, four lasers 110a-d are coupled to four outputs 220a-d of the multiple-output laser source by a four by four coupler, e.g., a four by four MMI coupler as shown. In such a system, if, for example 10 mW of optical power is required at each of the four outputs 220a-d, if each laser is designed to have the ability to generate an additional 1 dB of optical power (i.e., an output power that is greater by a factor of 1.26) at beginning of life (BOL) to ensure acceptable end-of-life (EOL) performance, and if each laser is further designed to have additional reserve power capability to ensure that full output power will be maintained if any one of the other lasers fails, then each laser may be designed to generate, at beginning of life, 4/3×1.26×10 mW, i.e., 16.8 mW. In some embodiments, one or more of the lasers of the multiple-output laser source may be shut off during normal operation, and may be turned on when one of the other lasers fails.

In some embodiments a system analogous to that of FIGS. 2 and 3 but with eight lasers and an eight by eight coupler may be used, reducing the reserve power factor needed in each laser, to enable the remaining lasers to fully compensate for the failure of one laser, from 4/3 to 8/7 (and the beginning of life power capability from 16.8 mW to 14.4 mW). If such a system is constructed with lasers having a reserve power factor of 4/3 (times any further reserve factor to account for differences between beginning of life and end of life performance) then it may be possible for the remaining lasers to fully compensate for the failure of any two of the lasers. In some embodiments the coupler (e.g., of FIG. 2 or FIG. 3, or of an analogous embodiment with an eight by eight coupler) is configured to deliver substantially equal optical power to each of its outputs (e.g., as nearly equal as readily available manufacturing processes will permit); in some embodiments the coupler is instead configured to deliver unequal power to its outputs. In some embodiments the laser wavelengths may be selected so that all of them fit within a 13 nm wide wavelength range (e.g., within the 13 nm range of wavelengths corresponding to a standard CWDM channel).

Figure 4:
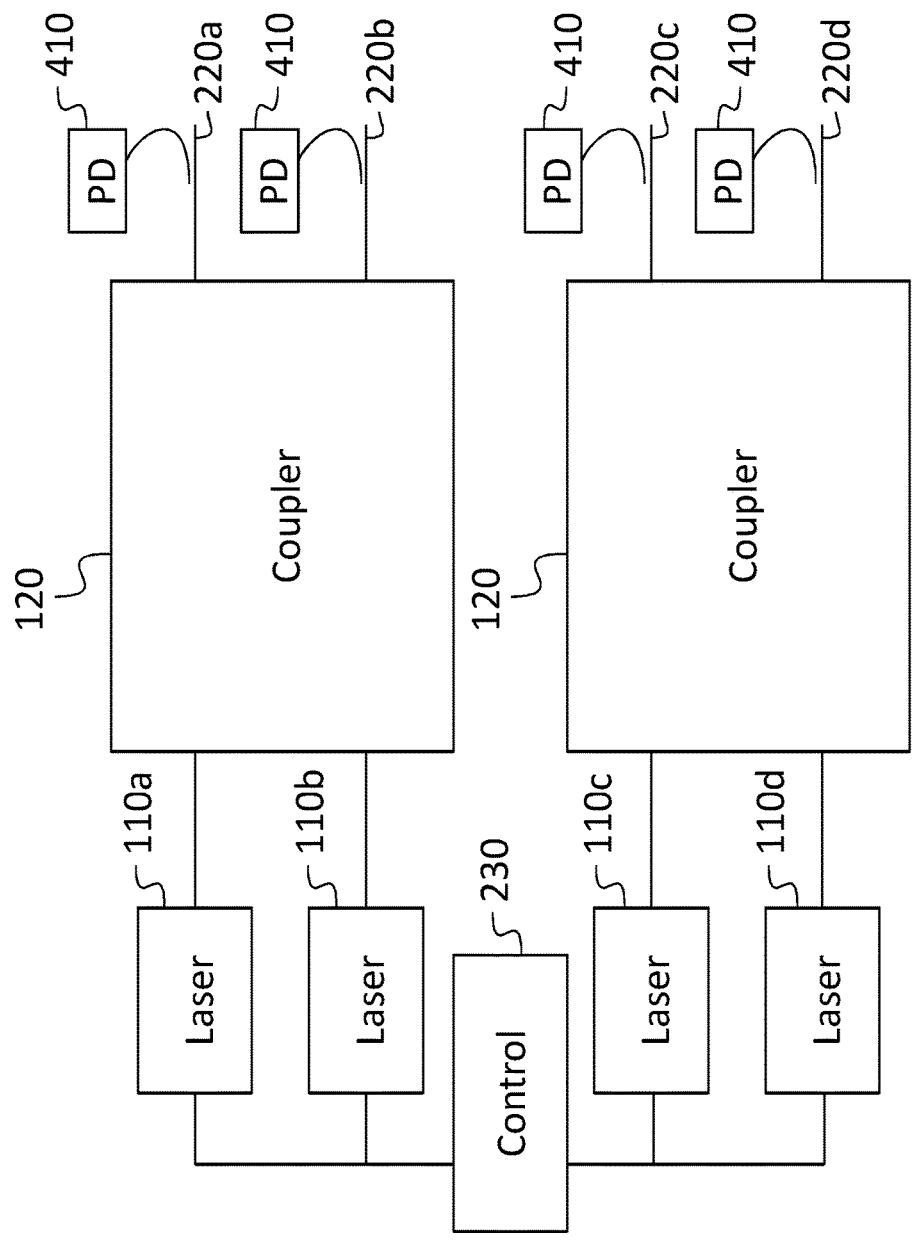
FIG. 4 is a block diagram of a laser light source, according to an embodiment of the present invention.

In some embodiments, the configuration of FIG. 2 may be operated with, during normal operation, one of the lasers (e.g., the second laser 110b) shut off, and the other laser (e.g., the first laser 110a) supplying all of the light produced by the multiple-output laser source. If the laser that normally supplies all of the power (e.g., the first laser 110a) fails, the other laser is started, by the control circuit 230, and it then supplies all of the light produced by the multiple-output laser source. Referring to FIG. 4, in one such embodiment, four lasers 110a-d are connected pairwise through two couplers 120 to four outputs 220a-d, the first and second lasers 110a, 110b being connected to the first and second outputs 220a, 220b through a first coupler 120, and the third and fourth lasers 110c, 110d being connected to the third and fourth outputs 220c, 220d through a second coupler 120. A fraction of the light at each of the outputs is tapped off, by, for example, a suitable fiber optic coupler, and fed to a respective one of four photodiodes 410. In some embodiments fewer photodiodes 410 (e.g., one per coupler 120) are used. When one or both of the photodiodes at the outputs of either one of the couplers 120 indicate that the laser has failed, the failed laser is shut down by the control circuit 230 and the other laser (the "spare" laser) is put into service by the control circuit 230. In some embodiments, more or fewer copies of the building block including two lasers 110 and a coupler 120 (of which two copies are present in FIG. 4) are present. In some embodiments, the inputs of a four by four MMI coupler may be connected to the four outputs of embodiment of FIG. 4, and the outputs of the four by four MMI coupler may then be the outputs of the multiple-output laser source. The outputs of the couplers 120 in the embodiments of FIGS. 3 and 4 may, like the outputs of the coupler 120 in the embodiment of FIG. 2, be connected to modulators (not shown in FIGS. 3 and 4).

In some embodiments, the effects of a laser failure may be further lessened by the use of a readily replaceable laser module, e.g., a laser module that may be replaced without opening an enclosure, or removing a card from a cage or a cage from a rack. In some embodiments the laser module is connectorized or "pluggable", and the laser module laser may be hot-swappable, i.e., it may be possible to remove a laser module and install a replacement laser module without shutting off system power, and without (i) damaging the laser module being removed, (ii) damaging the laser module being installed, (iii) damaging the circuits that the laser modules are connected to in operation, and (iv) interrupting the operation of any other data links in the system (e.g., links using other lasers than the one being replaced). In some embodiments (as discussed in further detail below) it may be possible to remove a laser module and install a replacement laser module without interrupting the operation of any data link in the system.

Figure 5:
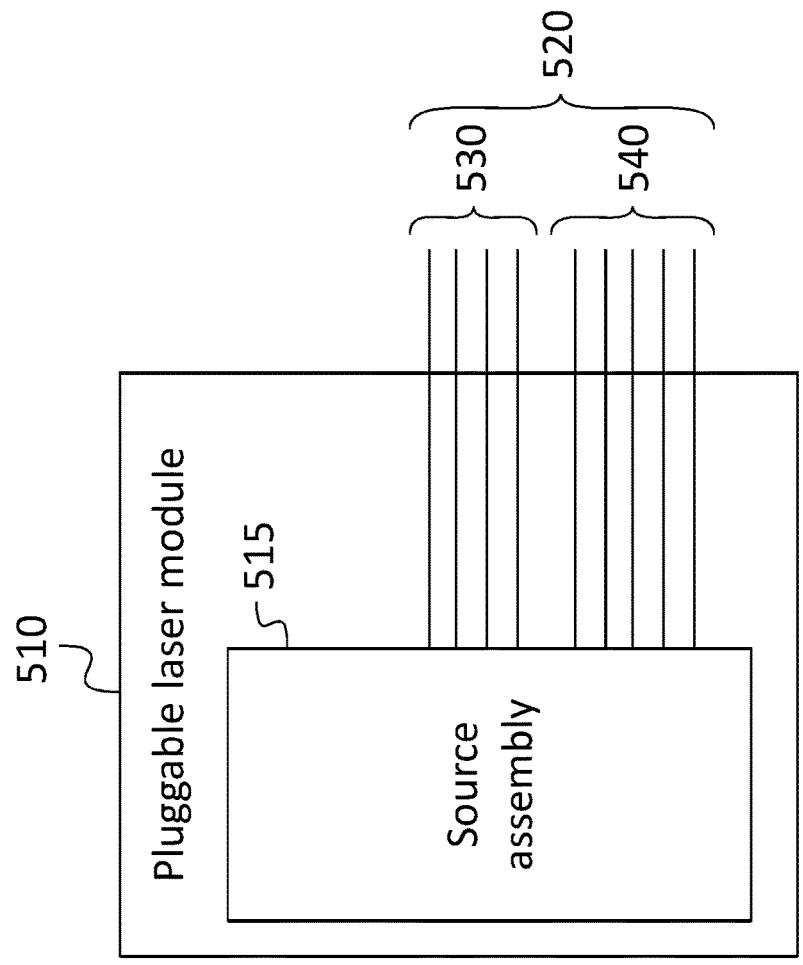
FIG. 5 is a block diagram of a pluggable laser module, according to an embodiment of the present invention.

FIG. 5 shows a schematic illustration of a pluggable laser module 510, in some embodiments. The laser module 510 includes a source assembly 515 and has a connector 520, and may be configured to be plugged into a corresponding connector on the front panel (e.g., on a readily accessible panel) of a piece of equipment, such as a card in a card cage (which may be in a rack), or an enclosure in a rack. The connector 520 includes a plurality of plugs, including one or more optical plugs (which, if there are several, may operate as a multi parallel fiber optical connector 530) and a plurality of electrical plugs (which together operate as an electrical connector 540). As such, the connector 520 operates as a composite connector, including an optical connector 530 and an electrical connector 540. Each of the one or more optical plugs includes an optical fiber that, in operation, carries light from the laser. The source assembly 515 may include a (i) single laser, e.g., with an associated control circuit, or (ii) a plurality of lasers, or (iii) a plurality of lasers, and, connected to the lasers, a coupler 120 (e.g., the source assembly 515 may include the system illustrated in FIG. 3 or the system illustrated in FIG. 4). In some embodiments the coupler 120 is part of a photonic integrated circuit (e.g. the coupler 120 may be an MMI coupler fabricated on a silicon photonic integrated circuit); this photonic integrated circuit may be in the source assembly 515, or it may instead be located downstream, e.g., on a photonics integrated circuit (e.g., together with one or more modulators) in a transmitter. An embodiment in which the source assembly 515 includes only a single laser (or a single laser and a control circuit), and in which the laser in the source assembly 515 is redundant (like, e.g., each of the lasers 110a, 110b in the embodiment of FIG. 2), it may be possible to remove and replace the pluggable laser module 510 containing this source assembly 515 (and the single laser it includes) if the laser fails, without impairing the operation of any of the data links in the system (i.e., without causing a decrease in unmodulated input optical power, at any modulator, sufficient to cause the modulator to fail to meet its optical output requirements), because after the failure and during the replacement, one or more other lasers may supply the power the failed laser would have supplied had it remained fully operational.

The electrical plugs provide electrical connections to the equipment to which the pluggable laser module 510 is connected, through which the pluggable laser module 510 receives electrical power to power the laser or lasers in the source assembly 515, and through which it may also receive control signals and send data signals (e.g., an (analog) sensing signal from a monitor photodiode in a laser in the source assembly 515). Each plug may, when the connector 520 is plugged into a corresponding front panel connector, engage a respective corresponding socket in the front panel connector. In some embodiments some or all of the elements shown as plugs in FIG. 5 are instead sockets configured to engage respective corresponding plugs in the front panel connector. In some embodiments all of the plugs and/or sockets of the connector 520 are parallel, as shown, so that the engagement direction of all of them is the same. In some embodiments, the pluggable optical module 510 contains all intelligence and nonvolatile memory to operate the laser at the right temperatures and optical power levels, without assistance of the piece of equipment, or "host board" to which it is connected. The host board may be responsible only for providing electrical power, optionally for providing a signal line to enable or disable the laser(s), and for monitoring the health and performance of the laser module 510.

Although exemplary embodiments of a laser light source have been specifically described and illustrated herein, many modifications and variations will be apparent to those skilled in the art. Accordingly, it is to be understood that a laser light source constructed according to principles of this invention may be embodied other than as specifically described herein. The invention is also defined in the following claims, and equivalents thereof.

What is claimed is:

1. A multiple-output laser source, comprising:
    a laser module comprising:
        a laser; and
        a composite connector, the composite connector comprising:
            an optical connector; and
            an electrical connector,
            the electrical connector and the optical connector having the same engagement direction;
    a plurality of lasers, including the laser of the laser module;
    a coupler, the coupler having a plurality of inputs each connected to an output of a respective laser, and a plurality of outputs, each connected to an output of the multiple-output laser source; and
    a control circuit configured to control the output power of the lasers of the plurality of lasers to be concurrently substantially equal during a first interval of time,
    to detect a failure of one of the plurality of lasers after the first interval of time, and
    to increase the output power of one or more of the remaining lasers in response to detecting the failure of one of the lasers.

2. The multiple-output laser source of claim 1, wherein the coupler is a multi-mode interference coupler.

3. The multiple-output laser source of claim 1, wherein the coupler is a codirectional coupler.

4. The multiple-output laser source of claim 1, wherein the coupler comprises two inputs and two outputs.

5. The multiple-output laser source of claim 4, wherein the coupler is configured:
    to receive optical power at a first input of the two inputs;
    to deliver a first fraction of the received optical power to a first output of the two outputs; and
    to deliver a second fraction, substantially equal to the first fraction, of the received optical power to a second output of the two outputs.

6. The multiple-output laser source of claim 1, wherein: the plurality of lasers comprises four lasers, and the coupler comprises four inputs and four outputs.

7. The multiple-output laser source of claim 1, wherein: the plurality of lasers comprises eight lasers, and the coupler comprises eight inputs and eight outputs.

8. The multiple-output laser source of claim 1, wherein the least frequency separation between any pair of lasers of the plurality of lasers is greater than 30 GHz.

9. The multiple-output laser source of claim 1, wherein the greatest wavelength separation between any pair of lasers of the plurality of lasers is less than 13 nm.

10. The multiple-output laser source of claim 1, further comprising a control circuit configured:
    to control the output power of a first laser of the plurality of lasers to be at a set power level;
    to detect a failure of the first laser, and,
    in response to detecting the failure of the first laser:
        to shut off the first laser;
        to turn on a second laser of the plurality of lasers; and
        to control the output power of the second laser to be at the set power level.

11. The multiple-output laser source of claim 1, wherein:
    the laser module is configured to be connected to a piece of equipment including a plurality of optical transmitters, a subset of the plurality of optical transmitters being configured to receive light directly from the laser module, and the remainder of the plurality of optical transmitters not being configured to receive light directly from the laser module,
    the laser module is configured to be:
        connected to the piece of equipment, and
        disconnected from to the piece of equipment,
    without shutting off power and:
        without damaging circuitry in the laser module,
        without damaging circuitry in the piece of equipment, and
        without interfering with the optical transmitters not configured to receive light directly from the laser module.

12. The multiple-output laser source of claim 1, wherein:
    the laser module is configured to be connected to a piece of equipment including a plurality of optical transmitters, a subset of the plurality of optical transmitters being configured to receive light directly from the laser module, and the remainder of the plurality of optical transmitters not being configured to receive light directly from the laser module,
    the laser module is configured to be:
        connected to the piece of equipment, and
        disconnected from to the piece of equipment,
    without shutting off power and:
        without damaging circuitry in the laser module,
        without damaging circuitry in the piece of equipment,
        without impairing the operation of the optical transmitters configured to receive light directly from the laser module, and
        without interfering with the optical transmitters not configured to receive light directly from the laser module.

13. The multiple-output laser source of claim 1, comprising a photonic integrated circuit, comprising:
    a first modulator;
    a second modulator; and
    the coupler.

14. The multiple-output laser source of claim 13, wherein:
    the composite connector is a first composite connector, and
    the laser of the laser module is a first laser, the multiple-output laser source further comprising:
  a second composite connector,
the second composite connector comprising:
  an optical connector; and
  an electrical connector,
    the electrical connector and the optical connector having the same engagement direction
  a second laser of the plurality of lasers being connected, through the second composite connector, to a second input of the plurality of inputs of the coupler,
  wherein the first laser is connected, through the optical connector of the first composite connector, to a first input of the plurality of inputs of the coupler.

15. The multiple-output laser source of claim 13, wherein the laser module comprises the photonic integrated circuit.

* * * * *